US012575449B2

(12) United States Patent
Schultz et al.

(10) Patent No.: US 12,575,449 B2
(45) Date of Patent: Mar. 10, 2026

(54) BACKSIDE POWER DELIVERY AND POWER GRID PATTERN TO SUPPORT 3D DIE STACKING

(71) Applicant: Advanced Micro Devices, Inc., Santa Clara, CA (US)

(72) Inventors: Richard T. Schultz, Fort Collins, CO (US); John J. Wuu, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 648 days.

(21) Appl. No.: 17/936,167

(22) Filed: Sep. 28, 2022

(65) Prior Publication Data

US 2024/0105675 A1      Mar. 28, 2024

(51) Int. Cl.
*H01L 23/538*      (2006.01)
*H01L 23/48*      (2006.01)
*H01L 23/528*      (2006.01)
*H01L 25/065*      (2023.01)
*H01L 25/18*      (2023.01)

(52) U.S. Cl.
CPC ........ *H01L 25/0652* (2013.01); *H01L 23/481* (2013.01); *H01L 23/5286* (2013.01); *H01L 23/5386* (2013.01)

(58) Field of Classification Search
CPC ............... H01L 23/481; H01L 23/5286; H01L 23/5386; H01L 23/50; H01L 25/0652; H01L 25/105; H01L 25/18
See application file for complete search history.

(56)            References Cited

U.S. PATENT DOCUMENTS

| | | | |
|---|---|---|---|
| 11,804,479 B2 | 10/2023 | Wuu et al. | |
| 2009/0166846 A1 | 7/2009 | Pratt et al. | |
| 2014/0097547 A1* | 4/2014 | Kuroda | H01L 25/0657 |
| | | | 257/777 |
| 2014/0319697 A1 | 10/2014 | Janzen et al. | |
| 2016/0203253 A1 | 7/2016 | Fang | |
| 2018/0138152 A1* | 5/2018 | Jong | H01L 25/117 |
| 2021/0082815 A1* | 3/2021 | Doornbos | H01L 23/5286 |
| 2021/0098441 A1* | 4/2021 | Wuu | H01L 24/08 |
| 2023/0139378 A1* | 5/2023 | Lee | H01L 23/49816 |
| | | | 257/690 |
| 2023/0395568 A1* | 12/2023 | Kim | H01L 25/0657 |

* cited by examiner

*Primary Examiner* — Omar F Mojaddedi
(74) *Attorney, Agent, or Firm* — Kowert, Hood, Munyon, Rankin & Goetzel, P.C.; Rory D. Rankin

(57)            ABSTRACT

An apparatus and method for efficiently routing power signals across semiconductor dies. A semiconductor fabrication process (or process) places a first semiconductor die in an integrated circuit and stacks a second semiconductor die vertically adjacent to the first semiconductor die. The process forms multiple backside metal layers vertically adjacent to a backside of a silicon substrate of the second semiconductor die. The process forms a first backside metal layer that includes at least a first power route that forms a rectangle within the first backside metal layer. The process forms a second backside metal layer that includes at least a second power rail that forms an L-shape within the second backside metal layer. The process connects one or more corners of the rectangle of the first power rail to a corresponding corner of a separate power rail of the second backside metal layer that forms an L-shape.

13 Claims, 7 Drawing Sheets

*Power Connections*
*100*

Backside VDD Metal N Route     (L-shapes)
110

Backside VSS Metal N Route     (L-shapes)
112

Backside VDD Metal N-1 Route     (Rectangles)
120

Backside VSS Metal N-1 Route     (Rectangles)
122

VDD TSV     (Inner Periphery)
130

VSS TSV     (Outer Periphery)
132

VDD Route
140
(Inner Periphery)

VSS Route
142
(Outer Periphery)

*System in Package 200*

Power Connections 300

Backside Power Connections 316

Backside Power Connections 314

Backside Power Connections 312

Backside Power Connections 310

*Method*
*600*

*Computing System*
*700*

BACKSIDE POWER DELIVERY AND POWER GRID PATTERN TO SUPPORT 3D DIE STACKING

BACKGROUND

Description of the Relevant Art

As both semiconductor manufacturing processes advance and on-die geometric dimensions reduce, semiconductor chips provide more functionality and performance. Progress has been made in three-dimensional integrated circuits (3D ICs) that include two or more layers of active electronic components integrated both vertically and horizontally into a single circuit. Components within these layers communicate using on-chip signaling, whether vertically or horizontally. Through silicon vias (TSVs) and groups of TSVs forming through silicon buses are used as interconnects between a base processor die and each of the semiconductor dies stacked above the host processor die.

While many advances have been made, design issues still arise with modern techniques in processing and integrated circuit design that limit potential benefits. One issue is efficient routing of control signals, data signals, and power signals between the motherboard and the multiple dies as well as the signals between the dies. The combination of through silicon vias (TSVs) and their corresponding keep out zones consume an appreciable amount of on-die area, which limit the amount of area to use for active devices and signal routes.

Voltage droop of modern integrated circuits has also become an increasing design issue with each generation of semiconductor chips. Voltage droop is a reduction in voltage value, or a $\Delta V$, on a node that causes the voltage value to fall below a minimum threshold. For memories and latches without recovery circuitry, stored values can be lost. Voltage droop constraints are not only an issue for portable computers and mobile communication devices, but also for high-performance desktop computers and server computers that use superscalar microprocessors.

A resistive voltage droop, which is also referred to as the "IR droop," is proportional to the multiplicative product of the current (I) flowing through a metal trace and the resistance (R) of this metal trace. Some of these metal traces are between the motherboard and a node of a transistor. Typically, the semiconductor chip includes 12 or more metal layers between the motherboard and nodes of transistors. The voltage droop, such as the IR droop, increases as the number of metal layers increase. As the number of nodes and signals increase on the semiconductor chip to provide more functionality, the area for routing the power signals, such as the power supply voltage references and the ground voltage references, reduce. Therefore, these power signals are routed again through numerous metal layers, which further increases the IR droop.

Further, traversing the multiple metal layers to route the power signals across the semiconductor chip increases the distance between contacts to the power signals. This distance widens the floorplan. The floorplan of the semiconductor die is limited unless the semiconductor package size increases. If the area for components of the die is not present in the floorplan, then the components do not fit on the same die. Accordingly, significant redesign is required along with possible moving or shifting of macro blocks in the floorplan. Such redesign consumes an appreciable amount of design time, which delays product releases.

In view of the above, methods and systems for efficiently routing power signals across semiconductor dies are desired.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Apparatuses and methods efficiently routing power signals across a semiconductor die are contemplated. In various implementations, a semiconductor fabrication process places a first semiconductor die in an integrated circuit and stacks a second semiconductor die vertically adjacent to the first semiconductor die. The semiconductor fabrication process (or process) forms multiple backside metal layers vertically adjacent to a backside of a silicon substrate of the second semiconductor die. The process forms a first backside metal layer that includes at least a first power route that forms a rectangle within the first backside metal layer. The process forms a second backside metal layer that includes at least a second power rail that forms an L-shape within the second backside metal layer. In various implementations, the first backside metal layer is located closer to active devices than the second backside metal layer, and the second backside metal layer includes a thickness and width of power routes that are greater than a thickness and a width of power routes in the first backside metal layer. The process connects at least one or more corners of the rectangle of the first power rail to a corresponding corner of a separate power rail of the second backside metal layer that forms an L-shape. Further details of the integrated circuit are provided in the following description of FIGS. 1-7.

Figure 1:
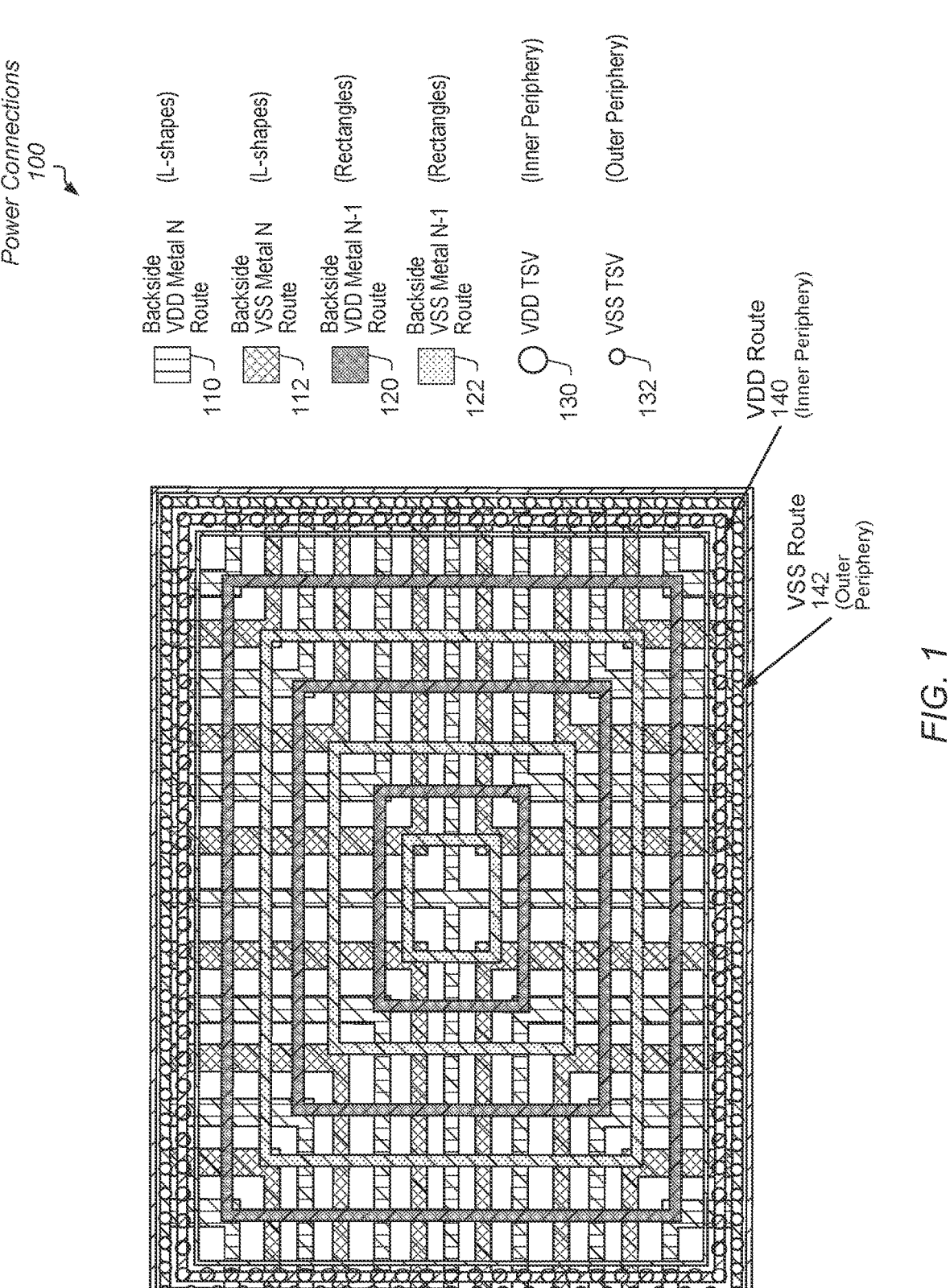
FIG. 1 is a generalized block diagram of a top view of power connections that utilize techniques to reduce power routing resistivity and reduces power consumption.

Referring to FIG. 1, a generalized block diagram is shown of a top view of power connections 100 that utilize techniques to reduce power routing resistivity and reduces power consumption. In various implementations, the power routes shown are provided in backside metal layers of a semiconductor die vertically stacked on top of another semiconductor die. The backside metal layers are formed below a semiconductor substate layer of the semiconductor die. Vias within the backside metal layers and a micro through silicon via (TSV) are used to connect the backside metal layers to nodes within standard cells and other circuitry of the semiconductor die.

Each of the two semiconductor dies that are vertically stacked can be representative of a variety of processing units, application specific integrated circuits (ASICs), digital signal processors (DSPs), memory arrays with a memory controller, and so forth. Three-dimensional (3D) packaging is used within a computing system to create a system-in-package (SiP). The SiP uses layers of active electronic components integrated both horizontally and vertically into a single circuit. Die-stacking technology is a fabrication process that enables the physical stacking of multiple separate pieces of silicon (integrated chips) together in a same package with high-bandwidth and low-latency interconnects.

The stack of backside metal layers can include any number of metal layers based on design requirement. In an implementation, the backside metal layers can include 6 metal layers from Metal0 (M0) to Metal5 (M5). As shown, the backside metal layers include at least the backside VDD metal N route 110 that is formed as L-shapes across the back of the semiconductor die (or die). Here, N is a positive integer greater than or equal to one. The backside metal layers also include the backside VSS metal N route 112 that is formed as L-shapes in the backside metal layer N. The backside metal layers further include the backside VDD metal N−1 route 120 and the backside VSS metal N−1 route 122. The backside VDD metal N−1 route 120 (or VDD route 120) and the backside VSS metal N−1 route 122 (or VSS route 122) are formed as rectangles in the backside metal layer N−1. Using the shape of a rectangle is one example of forming the VDD route 120 and the VSS route 122 as closed loops.

Vias and contacts are not shown for ease of illustration. However, the VDD routes 120 are connected to the VDD routes 110. For example, in various implementations, one or more corners of the rectangles of the VDD routes 120 are connected, by the use of a corresponding via or contact, to a corner of the L-shape of the VDD routes 110. In an implementation, each corner of one or more rectangles of the VDD routes 120 are connected, by the use of a corresponding via or contact, to a corresponding corner of a separate VDD route of the multiple VDD routes 110 of the metal layer N that forms an L-shape. In some implementations, a rectangle of a particular VDD route 120 is connected, by the use of multiple vias or contacts, to multiple locations of a particular VDD route 110 where the locations overlap both the rectangle shape of the particular VDD route 120 and the L-shape of the particular VDD route 110. In other words, a connection at the corners of the shapes can include multiple vias or contacts at these overlapping locations, which provides more connections than a single via or contact at a single corner. In a similar manner, the backside VSS metal N−1 routes 122 (or VSS routes 122) are connected to the backside VSS metal N−1 routes 112 (or VSS routes 112).

In addition, each end of the L-shape of the VDD routes 110 connects to the VDD route 140, which is an inner periphery route that goes all around the corresponding backside of the die as shown. One or more vias and contacts (not shown) connect an end of the L-shape of the VDD routes 110 to the VDD route 140 that routes around the inner periphery of the backside of the die. In addition, the VDD route 140 connects to the VDD through silicon via (TSV) 130. The TSV VDD route 130 traverses through each of the two semiconductor dies and routes a power supply reference voltage level from the motherboard to the periphery of the two semiconductor dies. In a similar manner, each end of the L-shape of the VSS routes 112 connects to the VSS route 142, which is an outer periphery route that goes all around the corresponding backside of the die as shown. One or more vias and contacts (not shown) connect an end of the L-shape of the VSS routes 112 to the VSS route 142 that routes around the outer periphery of the backside of the die. In addition, the VSS route 142 connects to the VSS TSV 132. The VSS TSV 132 traverses through each of the two semiconductor dies and routes a ground reference voltage level from the motherboard to the periphery of the two semiconductor dies.

It is understood that a silicon wafer, an integrated circuit, and a semiconductor package can be rotated and flipped. Therefore, the materials and layers being described would be rotated and flipped, and the orientations and directions would have a different meaning. Therefore, the terms "top," "bottom," "horizontal," "vertical," "above," and "below" can change as the power connections 100 are rotated or flipped, and the use of these terms in the description correspond to the orientation being shown in the power connections 100. Using the power connections 100, the corresponding integrated circuit provides both the power supply reference voltage level and the ground reference voltage level to the top semiconductor die of the vertically stacked dies around the perimeter of the two dies.

Figure 2:
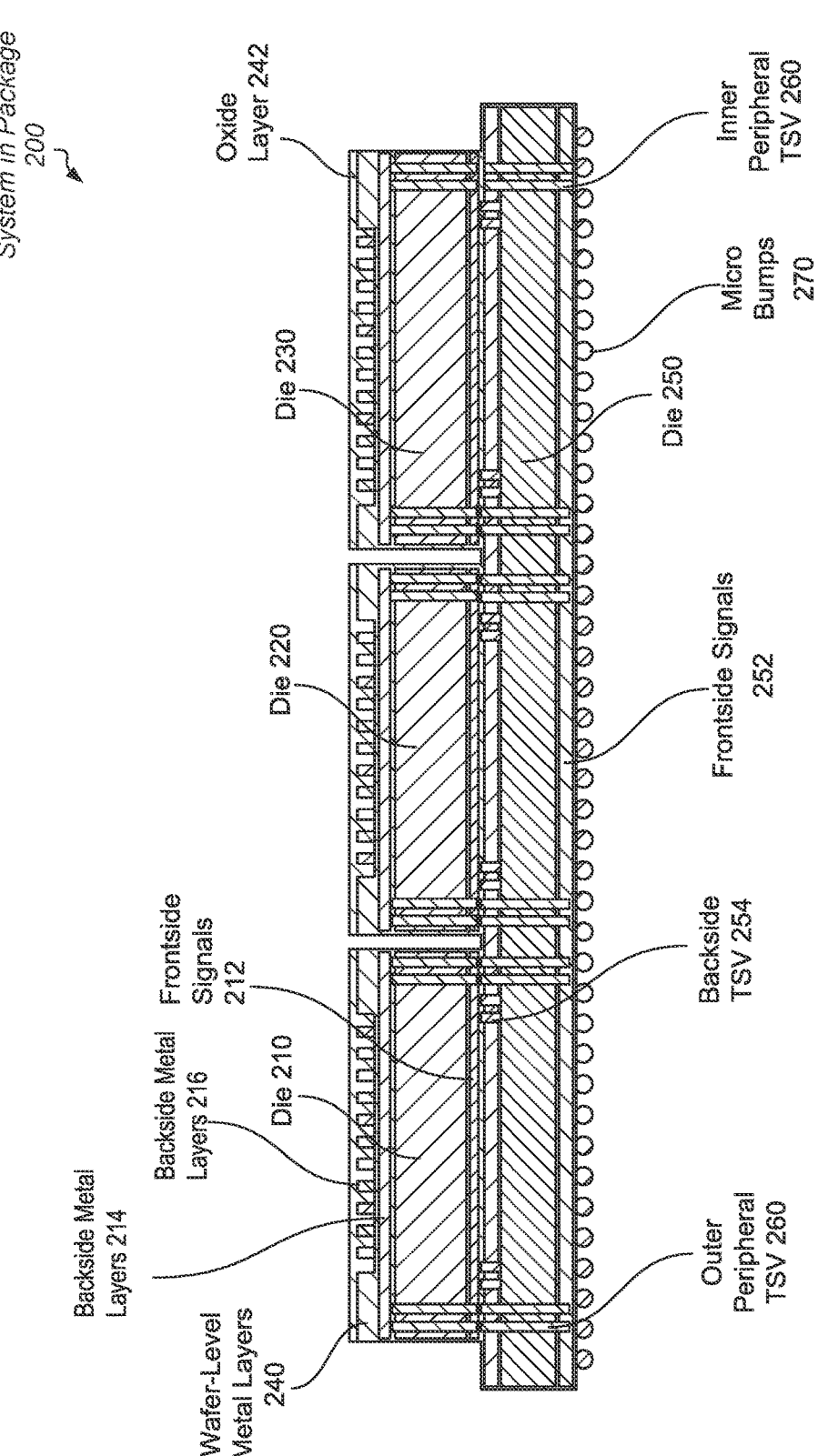
FIG. 2 is a generalized diagram of a system-in-package.

Turning now to FIG. 2, a generalized diagram is shown of a system-in-package (SiP) 200. In various implementations, three-dimensional (3D) packaging is used within a computing system to create the SiP 200. The SiP 200 includes the semiconductor base die 250 (or die 250) and the semiconductor dies 210, 220 and 230 (or dies 210, 220 and 230). In some implementations, one or more of the dies 220 and 230 is an instantiation of the die 210. As described earlier, die-stacking technology is a fabrication process that enables the physical stacking of multiple separate pieces of silicon (integrated chips) together in a same package with high-bandwidth and low-latency interconnects. The SiP 200 includes additional components not shown for ease of illustration such as one or more of an interposer, a package substrate, a redistribution layer (RDL), bonding pads, and so forth. Although the three dies 210, 220 and 230 are shown to be vertically stacked on top of the die 250, any number of dies, any number of types of dies, and any order of vertical stacking is used in other implementations.

External connections for the SiP 200 include the micro bumps 270 that provide control signals, data signals, and power signals from the motherboard to the dies 210, 220, 230 and 250. In other implementations, the SiP 200 includes C4 (controlled collapse chip connection) bumps to provide these signals from the motherboard to the dies 210, 220, 230 and 250. The micro bumps 270 allow the SiP 200 to be placed directly onto the surface of a printed circuit board or placed directly on a package substrate layer. In some implementations, the package substrate layer includes a redistribution layer (RDL), if a RDL is used. The frontside signals 252 are provided to the die 250 by the micro bumps 270. The backside TSVs 254 provide data communication between the die 250 and the dies 210, 220 and 230. For example, the frontside signals 212 are received by the die 210 from the backside TSVs 254. Although not shown, each of the dies 220 and 230 also receive frontside signals from the backside TSVs 254.

In various implementations, the peripheral TSVs 260 provide at least a power supply reference voltage level and a ground reference voltage level from the micro bumps 270 to the dies 210, 220 and 230 on the periphery of the dies 210-230. The oxide layer 242 provides insulation. The wafer-level metal layers 240 provide connectivity to other chiplets or other dies when the SiP 200 is combined with other integrated circuits of a computing system. In an implementation, the backside metal layers 214 provide power routes to the standard cells and other circuitry of the die 210. Further, the backside metal layers 216 also provide power routes to the die 210. In various implementations, the backside metal layers 214 and the backside metal layers 216 use the signal routes and shapes of the power connections 100 (of FIG. 1). In such implementations, a metal layer of the backside metal layers 214 are formed as rectangles similar to the VDD route 120 and the VSS route 122 (of FIG. 1). A metal layer of the backside metal layers 216 are formed as L-shapes similar to the VDD route 110 and the VSS route 112 (of FIG. 1). Similarly, the corresponding backside metal layers of the dies 220 and 230 also use the signal routes and shapes of the power connections 100 (of FIG. 1).

Using the above power connections for the backside metal layers 214 and 216 allows one or more of the dies 210-230 to be mounted face down on the die 250 such that the multiple frontside metal layers used for the frontside signals 212 are located at the bottom of the die and the active devices (transistors) are located at the top of the die closer to a heat sink for the SiP 200. Therefore, one or more of the dies 210-230 have improved thermal dissipation. In addition, having the power connections provided by the backside metal layers 214 and 216 allows power signals to be delivered to one or more of the dies 210-230 prior to assembly of the SiP 200 for testing.

In some implementations, one or more of the thickness and the width of the backside metal layers 216 is greater than a corresponding thickness and width of the backside metal layers 214. Therefore, the backside metal layers 216 reduce the resistivity of power routes, reduce voltage droop, and increase charge sharing of the power routes. From any point on the die 210 (or the die 220 and 230) the current flows through a relatively low resistive path through the peripheral TSVs 260 and the backside metal layers 214 and 216 using the techniques of the power connections 100 (of FIG. 1).

Figure 3:
FIG. 3 is a generalized block diagram of a top view of power connections that utilize techniques to reduce power routing resistivity and reduces power consumption.

Referring to FIG. 3, a generalized block diagram is shown of a top view of power connections 300 that utilize techniques to reduce power routing resistivity and reduces power consumption. In various implementations, the power connections 100 (of FIG. 1) are used in backside metal layers of a particular semiconductor die (or particular die), and this particular die is instantiated multiple times in a SiP. In various implementations, each of the power connections 310, 312, 314 and 316 is an instantiation of the power connections 100 (of FIG. 1). The shading used earlier to differentiate particular routes in the power connections 100 is not shown here in order not to confiscate the drawing. As shown, each of the power supply reference voltage level and the ground reference voltage level is routed from the motherboard to the TSVs on the periphery of the multiple instantiated dies. The power supply reference voltage level and the ground reference voltage level are then routed to internal nodes of the dies using the power connections 310, 312, 314 and 316.

Figure 4:
FIG. 4 is a generalized block diagram of a cross-section view of a computing system that uses power connections utilizing techniques to reduce power routing resistivity and reduces power consumption.
Figure 4:
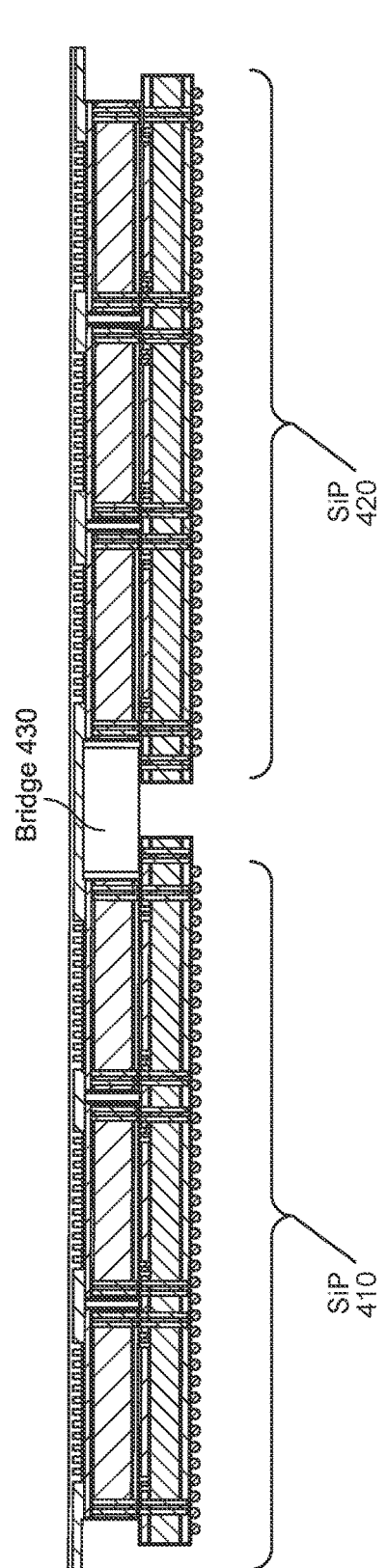

Turning now to FIG. 4, a generalized block diagram is shown of a cross-section view of a computing system 400 that uses power connections utilizing techniques to reduce power routing resistivity and reduces power consumption. In some implementations, the computing system 400 includes a SiP 410 and an instantiation of the same SiP with SiP 420. In various implementations, one or more of the SiP 410 and the SiP 420 include backside metal layers that use the signal routes and shapes of the power connections 100 (of FIG. 1). In between the SiP 410 and the SiP 420 is a bridge 430. In some implementations, the bridge 430 is one of a variety of integrated circuits that provides functionality for the computing system 400 that is not found in the SiP 410 or the SiP 420. In some implementations, the power routing of the computing system includes power signal signals that are routed over the bridge 430 such that the SiP 410 and the SiP 420 share the power signals.

Figure 5:
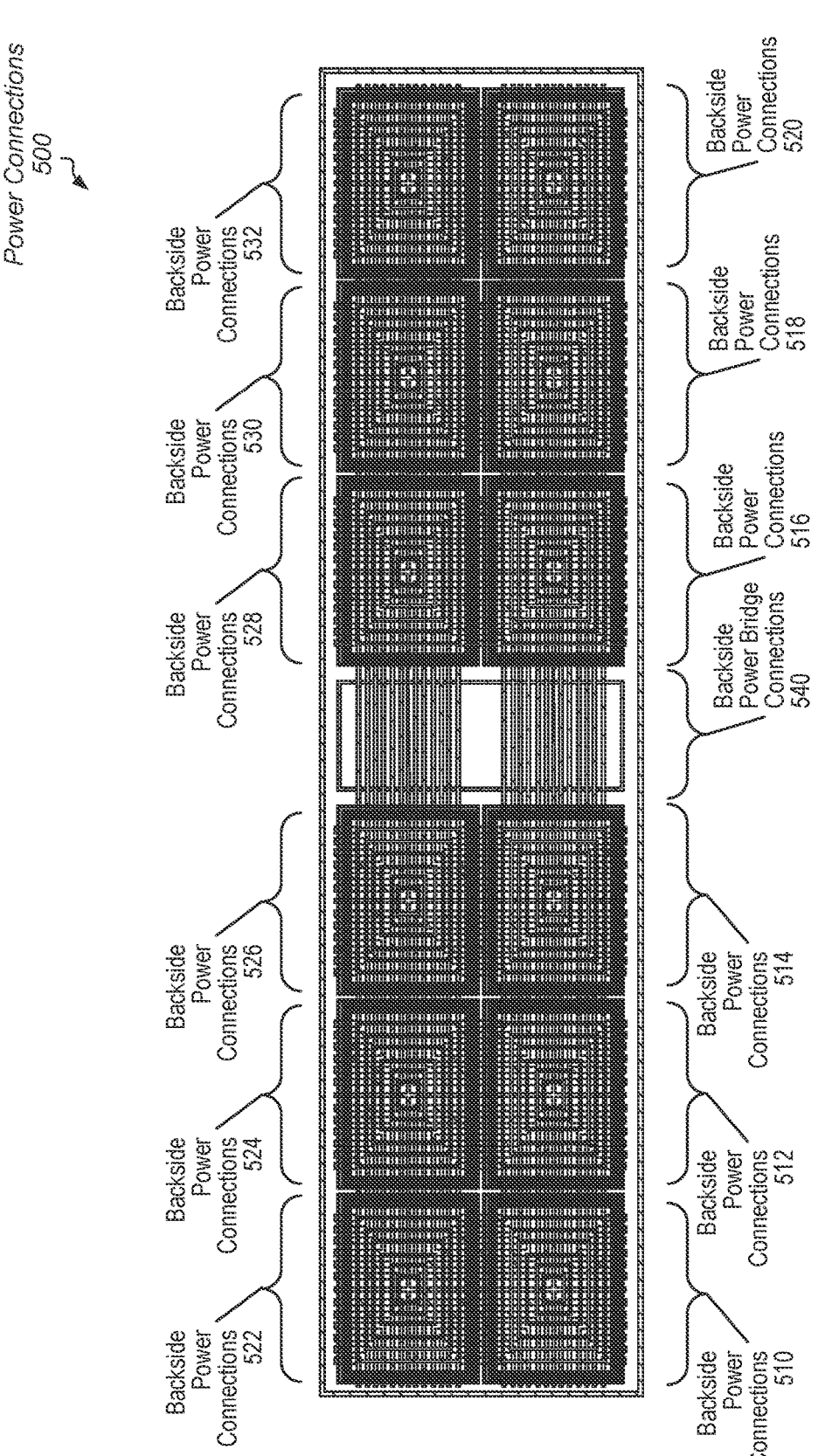
FIG. 5 is a generalized block diagram of a top view of power connections that utilize techniques to reduce power routing resistivity and reduces power consumption.

Referring to FIG. 5, a generalized block diagram is shown of a top view of power connections 500 that utilize techniques to reduce power routing resistivity and reduces power consumption. In various implementations, the power connections 100 (of FIG. 1) are used in backside metal layers of a particular semiconductor die (or particular die), and this particular die is instantiated multiple times in a SiP. In various implementations, each of the power connections 510-520 and 522-532 is an instantiation of the power connections 100 (of FIG. 1). The shading used earlier to differentiate particular routes in the power connections 100 is not shown here in order not to confiscate the drawing. As shown, each of the power supply reference voltage level and the ground reference voltage level is routed from the motherboard to the TSVs on the periphery of the multiple instantiated dies. The power supply reference voltage level and the ground reference voltage level are then routed to internal nodes of the dies using the power connections 510-520 and 522-532. In addition, the power supply reference voltage level and the ground reference voltage level are also routed across the backside power bridge connections 540.

Figure 6:
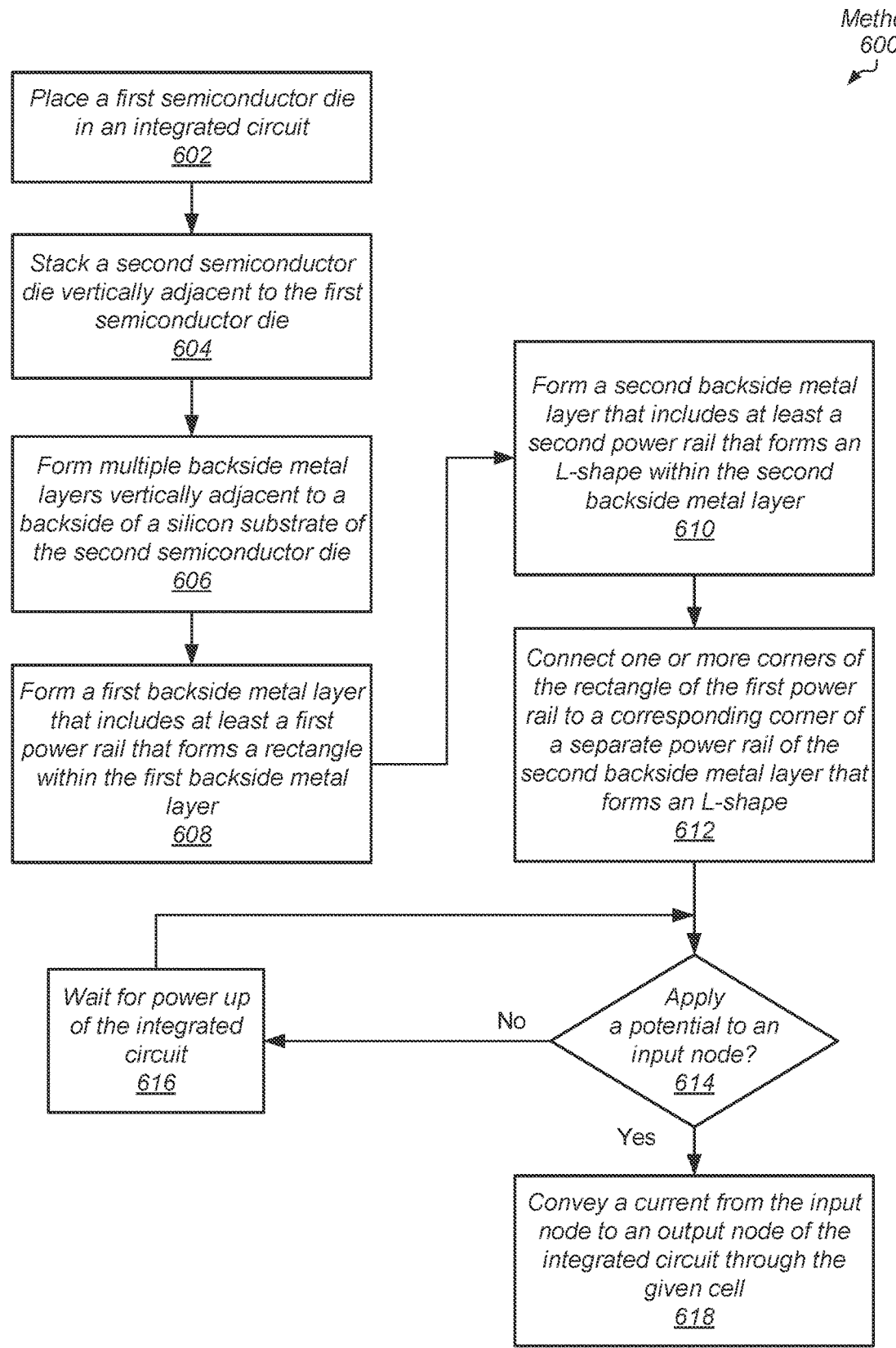
FIG. 6 is a generalized diagram of a cross-sectional view of a portion of an integrated circuit during integrated circuit fabrication with a silicon substrate layer of a single silicon wafer with transistors formed on two surfaces.

Referring now to FIG. 6, a generalized block diagram is shown of a method 600 for efficiently routing power signals across semiconductor dies. For purposes of discussion, the steps in this implementation are shown in sequential order. However, in other implementations some steps occur in a different order than shown, some steps are performed concurrently, some steps are combined with other steps, and some steps are absent.

A semiconductor fabrication process places a first semiconductor die in an integrated circuit (block 602). The semiconductor fabrication process (or process) stacks a second semiconductor die vertically adjacent to the first semiconductor die (block 604). The process forms multiple backside metal layers vertically adjacent to a backside of a silicon substrate of the second semiconductor die (block 606). The process forms a first backside metal layer that includes at least a first power route that forms a rectangle within the first backside metal layer (block 608). The process forms a second backside metal layer that includes at least a second power route that forms an L-shape within the second backside metal layer (block 610).

The process connects one or more corners of the rectangle of the first power route to a corresponding corner of a separate power route of the second backside metal layer that forms an L-shape (block 612). If a potential is not applied to an input node of the integrated circuit ("no" branch of the conditional block 614), then the integrated circuit waits for power up (block 616). However, if a potential is applied to the input node of the integrated circuit ("yes" branch of the conditional block 614), then the integrated circuit conveys a current from the input node to an output node through the given cell (block 618).

Figure 7:
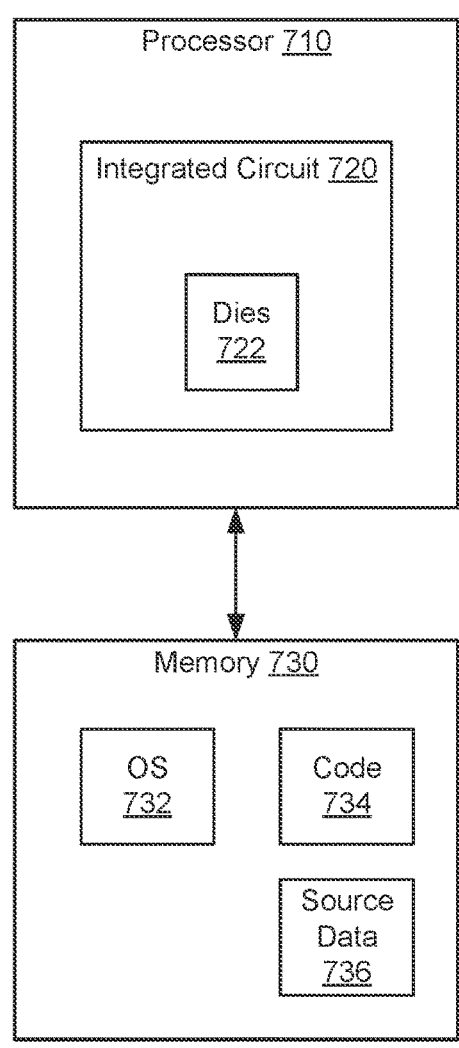
FIG. 7 is a generalized block diagram of a computing system with semiconductor dies that utilize power connections that reduce power routing resistivity and reduces power consumption While the invention is susceptible to various modifications and alternative forms, specific implementations are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

Referring to FIG. 7, a generalized block diagram is shown of a computing system 700 with semiconductor dies that utilize power connections that reduce power routing resistivity and reduces power consumption. The computing system 700 includes the processor 710 and the memory 730. Interfaces, such as a memory controller, a bus or a communication fabric, one or more phased locked loops (PLLs) and other clock generation circuitry, a power management unit, and so forth, are not shown for ease of illustration. It is understood that in other implementations, the computing system 700 includes one or more of other processors of a same type or a different type than processor 710, one or more peripheral devices, a network interface, one or more other memory devices, and so forth. In some implementations, the functionality of the computing system 700 is incorporated on a system on chip (SoC). In other implementations, the functionality of the computing system 700 is incorporated on a peripheral card inserted in a motherboard. The computing system 700 is used in any of a variety of computing devices such as a desktop computer, a tablet computer, a laptop, a smartphone, a smartwatch, a gaming console, a personal assistant device, and so forth.

The processor 710 includes hardware such as circuitry. For example, the processor 710 includes at least one integrated circuit 720. The integrated circuit 720 includes multiple semiconductor dies 722 where one or more of these semiconductor dies 722 use the signal routes and shapes of the power connections 100 (of FIG. 1). In some implementations, the processor 710 includes one or more processing units. In some implementations, each of the processing units includes one or more processor cores capable of general-purpose data processing, and an associated cache memory subsystem. In such an implementation, the processor 710 is a central processing unit (CPU). In another implementation, the processing cores are compute units, each with a highly parallel data microarchitecture with multiple parallel execution lanes and an associated data storage buffer. In such an implementation, the processor 710 is a graphics processing unit (GPU), a digital signal processor (DSP), or other.

In some implementations, the memory 730 includes one or more of a hard disk drive, a solid-state disk, other types of flash memory, a portable solid-state drive, a tape drive and so on. The memory 730 stores an operating system (OS) 732, one or more applications represented by code 734, and at least source data 736. Memory 730 is also capable of storing intermediate result data and final result data generated by the processor 710 when executing a particular application of code 734. Although a single operating system 732 and a single instance of code 734 and source data 736 are shown, in other implementations, another number of these software components are stored in memory 730. The operating system 732 includes instructions for initiating the boot up of the processor 710, assigning tasks to hardware circuitry, managing resources of the computing system 700 and hosting one or more virtual environments.

Each of the processor 710 and the memory 730 includes an interface unit for communicating with one another as well as any other hardware components included in the computing system 700. The interface units include queues for servicing memory requests and memory responses, and control circuitry for communicating with one another based on particular communication protocols. The communication protocols determine a variety of parameters such as supply voltage levels, power-performance states that determine an operating supply voltage and an operating clock frequency, a data rate, one or more burst modes, and so on.

It is noted that one or more of the above-described implementations include software. In such implementations, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various implementations, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the implementations above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit comprising:
a first semiconductor die;
a second semiconductor die stacked vertically adjacent to the first semiconductor die; and
a plurality of metal layers vertically adjacent to a backside of a silicon substrate of the second semiconductor die; and
wherein a first metal layer of the plurality of metal layers comprises at least a first power route that forms a closed loop within the first metal layer; and
wherein responsive to a potential being applied to an input node of a cell of the integrated circuit, a current is conveyed from the input node to an output node of the cell through at least the first power route.

2. The integrated circuit as recited in claim 1, wherein a second metal layer of the plurality of metal layers comprises at least a second power route that:
forms an L-shape within the second metal layer; and
connects to the first power route through a via between the first metal layer and the second metal layer.

3. The integrated circuit as recited in claim 2, wherein:
the closed loop of the first power route is a rectangle; and
a corner of the L-shape of the second power route connects to a corner of the rectangle of the first power route through the via between the first metal layer and the second metal layer.

4. The integrated circuit as recited in claim 3, wherein each corner of the rectangle of the first power route connects to a corresponding corner of a separate power route of the second plurality of metal layers that forms an L-shape.

5. The integrated circuit as recited in claim 2, wherein each end of the L-shape of the second power route connects to a corresponding through silicon via (TSV) that traverses through each of the first semiconductor die and the second semiconductor die to route a power supply signal on a periphery of the first semiconductor die and the second semiconductor die.

6. The integrated circuit as recited in claim 2, wherein a thickness of the second power route is greater than a thickness of the first power route.

7. The integrated circuit as recited in claim 2, further comprising a third semiconductor die stacked horizontally adjacent to the second semiconductor die, wherein the second power route physically aligns with a third power route of the third semiconductor die.

8. A computing system comprising:
a memory configured to store instructions of one or more tasks and source data to be processed by the one or more tasks;
an integrated circuit configured to execute the instructions using the source data, wherein the integrated circuit comprises:
a first semiconductor die;
a second semiconductor die stacked vertically adjacent to the first semiconductor die; and
a plurality of metal layers vertically adjacent to a backside of a silicon substrate of the second semiconductor die; and
wherein a first metal layer of the plurality of metal layers comprises at least a first power route that forms a closed loop within the first metal layer; and
wherein responsive to a potential being applied to an input node of a cell of the integrated circuit, a current is conveyed from the input node to an output node of the cell through at least the first power route.

9. The computing system as recited in claim 8, wherein a second metal layer of the plurality of metal layers comprises at least a second power route that:
forms an L-shape within the second metal layer; and
connects to the first power route through a via between the first metal layer and the second metal layer.

10. The computing system as recited in claim 9, wherein:
the closed loop of the first power route is a rectangle; and
a corner of the L-shape of the second power route connects to a corner of the rectangle of the first power route through the via between the first metal layer and the second metal layer.

11. The computing system as recited in claim 10, wherein each corner of the rectangle of the first power route connects to a corresponding corner of a separate power route of the second plurality of metal layers that forms an L-shape.

12. The computing system as recited in claim 9, wherein each end of the L-shape of the second power route connects to a corresponding through silicon via (TSV) that traverses through each of the first semiconductor die and the second semiconductor die to route a power supply signal on a periphery of the first semiconductor die and the second semiconductor die.

13. The computing system as recited in claim 9, wherein a thickness of the second power route is greater than a thickness of the first power route.

* * * * *